(12) United States Patent
Chung et al.

(10) Patent No.: US 11,490,530 B2
(45) Date of Patent: Nov. 1, 2022

(54) SPRING MECHANISMS FOR DISPLAY ENCLOSURES

(71) Applicant: Hewlett-Packard Development Company, L.P., Spring, TX (US)

(72) Inventors: Tien Liang Chung, Taipei (TW); Sheng-Kai Su, Taipei (TW); Ching Ho Wang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/944,811

(22) Filed: Jul. 31, 2020

(65) Prior Publication Data
US 2022/0039272 A1    Feb. 3, 2022

(51) Int. Cl.
*H05K 5/02* (2006.01)
*H05K 5/00* (2006.01)
*F16B 39/26* (2006.01)

(52) U.S. Cl.
CPC ........... *H05K 5/0208* (2013.01); *F16B 39/26* (2013.01); *H05K 5/0017* (2013.01)

(58) Field of Classification Search
None
See application file for complete search history.

(56) References Cited

U.S. PATENT DOCUMENTS

| | | | |
|---|---|---|---|
| 5,535,095 A | 7/1996 | Slater et al. | |
| 5,716,180 A | 2/1998 | Bowers | |
| 7,627,973 B2 | 12/2009 | Lin et al. | |
| 8,797,729 B2 | 8/2014 | Mukaide et al. | |
| 9,258,920 B2* | 2/2016 | Arheit | H05K 13/00 |
| 9,307,182 B2* | 4/2016 | Lee | H04N 5/64 |
| 9,958,898 B1* | 5/2018 | Shaw | G06F 1/1601 |
| 10,261,239 B2* | 4/2019 | Wu | G02F 1/133608 |
| 2008/0054213 A1* | 3/2008 | Ranaldo | F02M 63/0024 |
| | | | 251/214 |
| 2014/0347567 A1* | 11/2014 | Ito | F21V 15/01 |
| | | | 348/791 |
| 2015/0296633 A1* | 10/2015 | Murata | H05K 5/0217 |
| | | | 361/679.01 |
| 2017/0034936 A1* | 2/2017 | Min | H05K 5/0234 |

FOREIGN PATENT DOCUMENTS

JP          5015836 B2    8/2012
KR   20080092895 A * 10/2008

\* cited by examiner

*Primary Examiner* — Xanthia C Cunningham
(74) *Attorney, Agent, or Firm* — Brooks Cameron & Huebsch PLLC

(57) ABSTRACT

In some examples, a device can include a display coupled to a locking mechanism, wherein the locking mechanism applies a first force in a first direction, an enclosure coupled to the display with the locking mechanism, and a spring mechanism coupled to the enclosure and the locking mechanism to prevent a tension level between the display and the enclosure from exceeding a tension threshold, wherein the spring mechanism applies a second force in a second direction.

13 Claims, 4 Drawing Sheets

SPRING MECHANISMS FOR DISPLAY ENCLOSURES

BACKGROUND

A computing device can allow a user to utilize computing device operations for work, education, gaming, multimedia, and/or other uses. Computing devices can be utilized in a non-portable setting, such as at a desktop, and/or be portable to allow a user to carry or otherwise bring the computing device with while in a mobile setting. These computing devices can include display devices to display images.

DETAILED DESCRIPTION

Figure 1:
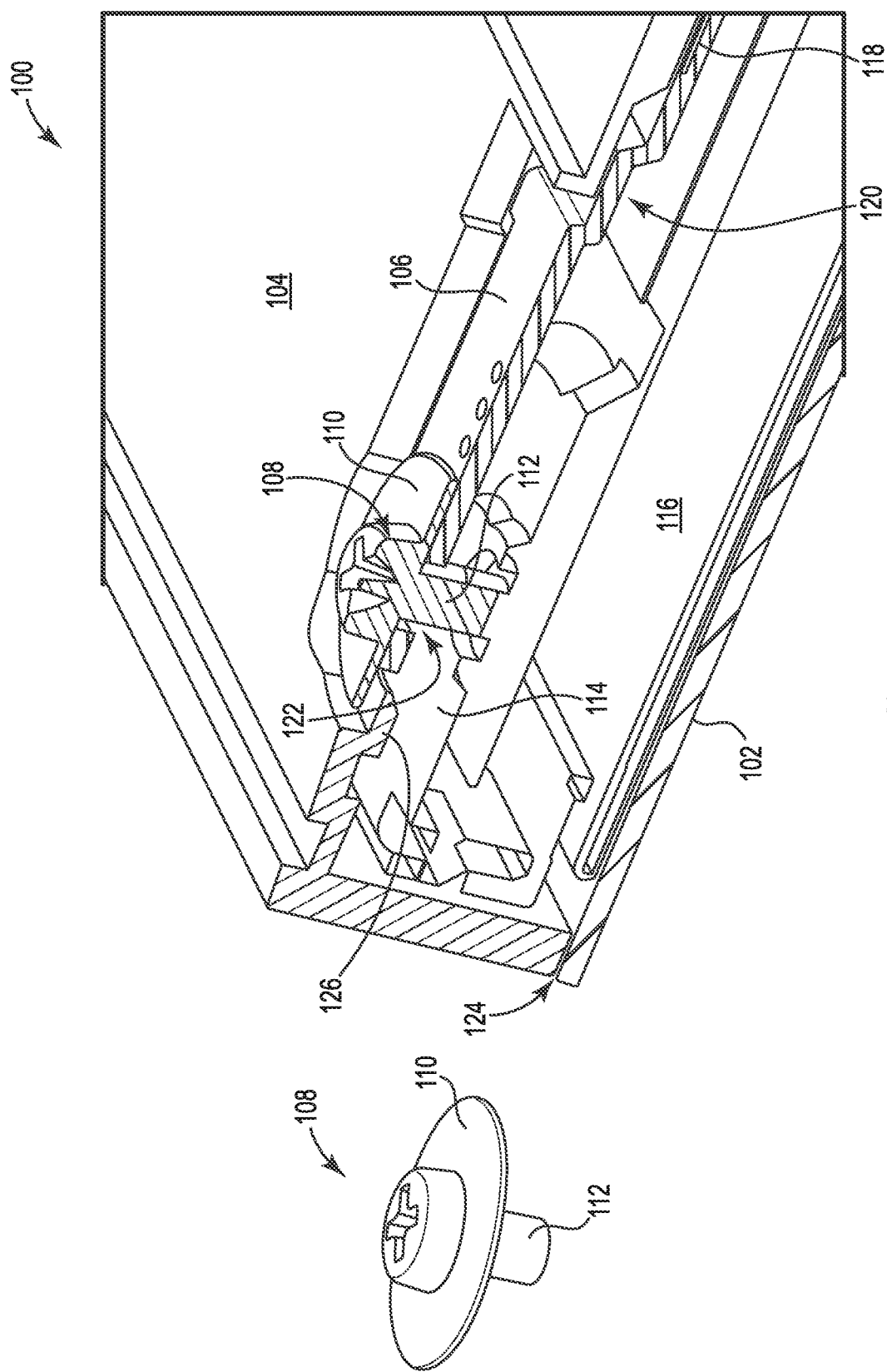
FIG. 1 is an example of a device including a spring mechanism for display enclosures, consistent with the present disclosure.

A user may utilize a computing device for various purposes, such as for business and/or recreational use. As used herein, the term "computing device" refers to an electronic system having a processing resource and a memory resource. Examples of computing devices can include, for instance, a laptop computer, a notebook computer, a desktop computer, networking device (e.g., router, switch, etc.), and/or a mobile device (e.g., a smart phone, tablet, personal digital assistant, smart glasses, a wrist-worn device, etc.), among other types of computing devices.

In some examples, the computing devices can include display devices that can include a display portion and an enclosure portion. As used herein, a display or display portion refers to an electronic device that is capable of generating a visual representation of electronic data. As used herein, an enclosure or enclosure portion refers to a barrier to prevent exterior elements from interacting with components within the enclosure. In some examples, the enclosure can be utilized to protect the electrical components of the display and/or protect a user from the electrical components of the display.

In some examples, a plurality of different displays can have different dimensions. As used herein, display dimensions can include a height, length, and/or width of the display. For example, a first display can have a first set of dimensions and a second display can have a second set of dimensions that are different than the first set of dimensions. In some examples, even when the first set of dimensions include the same or similar height and length, they may have different widths or thicknesses. In previous systems each of the plurality of different displays can utilize a corresponding different enclosure that is manufactured to receive the particular dimensions of the display. This can increase cost to manufacturers since each display can utilize a corresponding enclosure that may not be utilized for other types of displays.

The present disclosure relates to spring mechanisms for display enclosures to allow a plurality of different displays to be coupled to a particular type of enclosure. In this way, the same enclosure can be utilized for a plurality of displays with different dimensions, which can lower manufacturing costs. In some examples, a device can include a display coupled to a locking mechanism. In these examples, the locking mechanism can apply a first force in a first direction. In these examples, the device can include an enclosure coupled to the display with the locking mechanism. In these examples, the device can include a spring mechanism coupled to the enclosure and the locking mechanism to prevent a tension level between the display and the enclosure from exceeding a tension threshold and the spring mechanism can apply a second force in a second direction. In this way, the first force in the first direction can be an opposing force to the second force in the second direction to prevent the tension level between the display and the enclosure form exceeding the tension threshold. Utilizing the spring mechanism to prevent the tension level between the display and the enclosure can allow the display to be coupled to the enclosure such that displays with different dimensions can be coupled to the enclosure. In this way, each of the displays with different dimensions can be utilized with the enclosure without damaging the display due to tension that is above the threshold or without utilizing a gap between the enclosure and display.

FIG. 1 is an example of a device 100 including a spring mechanism 106 for display enclosures 104, consistent with the present disclosure. The device 100 can illustrate a cross section of a display 102 coupled to an enclosure 104. As described herein, the enclosure 104 can be utilized for a plurality of different displays that have different parameters or dimensions. For example, the enclosure 104 can be coupled to the display 102 as illustrated in FIG. 1. In this example, the display 102 can include a first set of dimensions (e.g., height, length, width, etc.). In this example, the enclosure 104 may also be utilized with a display that is different than display 102 when the display includes a second set of dimensions that are different than the first set of dimensions. In some examples, the spring mechanism 106 can be utilized to prevent a tension between the enclosure 104 and the display 102 from exceeding a threshold tension level.

In some examples, the device 100 can include a spring mechanism 106 that is coupled to a portion of the enclosure 104 at a coupling location 118. In some examples, the coupling location 118 can be positioned between a surface of the enclosure 104 and the display 102. For example, the coupling location 118 of the spring mechanism 106 can be positioned within the enclosure 104 such that a portion of the spring mechanism 106 is covered by the enclosure 104 when the display 102 is coupled to the enclosure 104. The spring mechanism 106 can be coupled to the coupling location 118 in a number of ways. For example, the spring mechanism 106 can be permanently or semi-permanently coupled to the enclosure 104. In a specific example, the spring mechanism 106 can be molded into the enclosure 104 at the coupling location 118.

In some examples, the spring mechanism 106 can include a resilient portion 120 positioned between the coupling location 118 and an aperture 122 to receive a locking mechanism 108. As used herein, a resilient portion 120 can include a portion that can be pressed, pulled, or moved in a direction and return to a previous shape. For example, the resilient portion 120 can be spring loaded with a particular spring constant to apply an opposite force when the locking mechanism 108 is coupled to a mounting bracket 114 of the display 102. That is, the resilient portion 120 can apply a force in a direction away from the display 102 while the locking mechanism 108 applies a force in a direction toward the display 102. In this way, the locking mechanism 108 can be coupled to the mounting bracket 114 without exceeding the tension threshold between the display 102 and the enclosure 104.

In some examples, the spring mechanism 106 can provide a particular quantity of spring force on the enclosure 104 when the locking mechanism 108 is in physical contact with the enclosure 104. As described herein, the spring mechanism 106 can provide a spring force, utilizing the resilient portion 120, on the enclosure 104 when a lip portion 110 is in physical contact with a tab 126 of the enclosure 104. In this way, the tension between the display 102 and the enclosure 104 is prevented from exceeding a tension threshold. In some examples, the spring mechanism 106 can include a spring constant based on a mass of the plurality of displays that can be utilized with the enclosure 104. As used herein, a spring constant includes a characteristic of a spring mechanism 106 or resilient portion 120 that is defined as the ratio of the force affecting the spring mechanism 106 to the displacement caused by the locking mechanism 108.

In some examples, the spring mechanism 106 can include an aperture 122 that can be utilized to receive an extended portion 112 of the locking mechanism 108. In some examples, the locking mechanism 108 can be a bolt with a threaded extended portion 112 that can be threaded onto a corresponding threaded portion of the mounting bracket 114. In some examples, the locking mechanism 108 can include a lip portion 110 that can prevent the locking mechanism 108 from protruding past the spring mechanism 106 and/or to provide a force on to the spring mechanism 106. In addition, the lip portion 110 can extend beyond the spring mechanism 106 to interact with a portion of the enclosure 104. In some examples, the locking mechanism 108 can include a washer instead of the lip portion 110 to be in physical contact with the spring mechanism 106 and the enclosure 104.

In some examples, a first portion of the locking mechanism 108 can interact with the enclosure 104 and a second portion of the locking mechanism 108 can interact with the spring mechanism 106. In these examples, the first portion of the locking mechanism 108 can include a portion of the lip portion 110 that extends beyond the spring mechanism 106 to interact with a tab 126 and the second portion of the locking mechanism 108 can include a portion of the lip portion 110 that interacts with the spring mechanism 106. That is, the first portion of the locking mechanism 108 can include a first lip portion to physically interact with the enclosure 104 and the second portion of the locking mechanism 108 can include a second lip portion to physically interact with the spring mechanism 106. In some examples, the first portion of the locking mechanism 108 interacts with the enclosure 104 when the display 102 is in physical contact with a portion of the enclosure 104. In this way, a gap 124 between the display 102 and the enclosure 104 can be removed or reduced.

In some examples, the enclosure 104 can include a tab 126 that can interact with the lip portion 110 when the locking mechanism 108 is to be stopped or prevented from applying additional force in the direction of the display 102. In some examples, the tab 126 can be positioned at a location below a surface of the enclosure 104 to allow the locking mechanism 108 to provide a force on the spring mechanism 106 and/or the resilient portion 120 of the spring mechanism 106. For example, the tab 126 can be a portion of the enclosure 104 and/or coupled to the enclosure 104 positioned at or below the resilient portion 120 of the spring mechanism 106 to allow the locking mechanism 108 to provide a force on the resilient portion 120 of the spring mechanism 106.

In some examples, a space between the tab 126 and a lip portion 110 of the locking mechanism 108 can correspond to a gap 124 between the enclosure 104 and the display 102. In some examples, the gap 124 can be lowered or eliminated when the lip portion 110 of the locking mechanism 108 is in contact with the tab 126 of the enclosure 104. In this way, the spring mechanism 106 can apply a particular level of tension between the display 102 and the enclosure 104 such that the gap 124 is removed even when dimensions of the display 102 are different. For example, the display 102 can include components 116 that can be utilized to generate images on the display 102. As described herein, the display 102 and/or components 116 can have a particular thickness, which can make it difficult for the same enclosure 104 to be utilized by a plurality of different displays including display 102.

Figure 2:
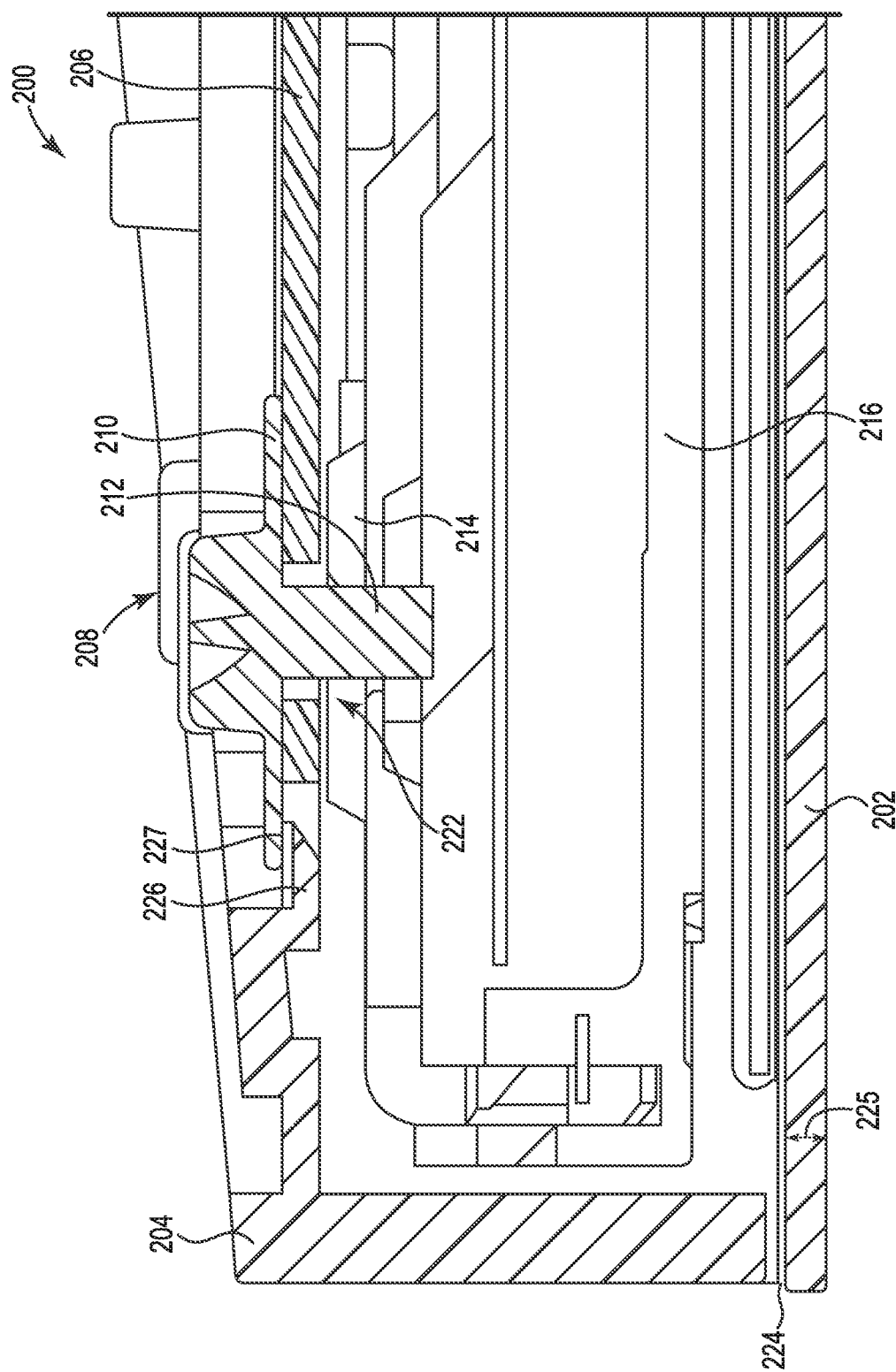
FIG. 2 is an example of a device including a spring mechanism for display enclosures, consistent with the present disclosure.

FIG. 2 is an example of a device 200 including a spring mechanism 206 for display enclosures 204, consistent with the present disclosure. In some examples, the device 200 can include the same or similar components as device 100 as referenced in FIG. 1. For example, the device 200 can include a display 202 that includes components 216 that can be coupled to an enclosure 204. In some examples, the device 200 can include a spring mechanism 206 that includes a first end coupled to an enclosure 204 and a second end that includes an aperture 222. In some examples, the device 200 can include a locking mechanism 208 to pass through the aperture 222 to couple a display 202 to the enclosure 204. Furthermore, in some examples, the device 200 can include a tab 226 coupled to the enclosure 204 to interact with the locking mechanism 208 to prevent the locking mechanism 208 from exceeding a tension threshold between the enclosure 204 and the display 202.

As described herein, the display 202 can be coupled to the enclosure 204 utilizing a spring mechanism 206 and a locking mechanism 208. The device 200 can illustrate when the display 202 includes a gap 224 between the display 202 and the enclosure 204 when a space 227 between the lip portion 210 of the locking mechanism 208 and a tab 226 of the enclosure 204. In some examples, the distance of the gap 224 can be the same or similar as the distance of the space 227. In some examples, a first gap (e.g., space 227) between the first portion of the locking mechanism 208 can correspond to a second gap (e.g., gap 224) between the display 202 and the enclosure 204.

In some examples, the spring mechanism 206 can include an aperture 222 that can be utilized to receive an extended portion 212 of the locking mechanism 208, As described herein, the locking mechanism 208 can be a bolt with a threaded extended portion 212 that can be threaded onto a corresponding threaded portion of the mounting bracket 214. In some examples, the locking mechanism 208 can include a threaded portion to move the display 202 closer to the enclosure 204 as the locking mechanism 208 is threaded on to a corresponding threaded portion of the enclosure 204 or mounting bracket 214. In some examples, the locking mechanism 208 can include a lip portion 210 that can prevent the locking mechanism 208 from protruding past the spring mechanism 206 and/or to provide a force on to the spring mechanism 206. In addition, the lip portion 210 can extend beyond the spring mechanism 206 to interact with a tab 226 of the enclosure 204.

In some examples, the spring mechanism 206 can include a resilient portion to provide a force on the locking mechanism 208 away from the display 202 to relieve a tension between the display 202 and the enclosure 204 when the gap 224 is closed such that the display 202 makes physical contact with the enclosure 204. In this way, the spring mechanism 206 can be utilized to allow the locking mechanism to make physical contact with the tab 226 of the enclosure 204 to close the gap 224 between the display 202 and the enclosure 204 without exceeding a threshold tension between the display 202 and the enclosure 204. That is, the spring mechanism 206 can apply a particular tension on the enclosure 204 when the locking mechanism 208 is in physical contact with the tab 226. For example, without the spring mechanism 206 to apply an opposite force to the locking mechanism 208, the locking mechanism 208 may be over tightened to the mounting bracket 214 that can cause a tension between the display 202 and the enclosure 204 to exceed a tension threshold, which can damage the display 202 and/or enclosure 204.

As described herein, the enclosure 204 can be utilized with a plurality of different displays including the display 202. For example, the display 202 can include a particular dimension such as a particular thickness 225. As used herein, a thickness 225 can include a distance between a front surface and a rear surface of the display 202. For example, the thickness 225 can include a distance between a first surface of the display 202 to display images and a second surface of the display that includes components 216. As described herein, the components 216 can be electrical components that can be utilized to display images on the display side of the display 202.

As described herein, the enclosure 204 can be utilized with a display 202 with a particular thickness 225. In some examples, the same enclosure 204 can be utilized with a display that includes a greater thickness than the particular thickness 225 of the display 202. For example, the display 202 can include a greater thickness than illustrated by the particular thickness 225. In this example, the gap 224 may be filled with the greater thickness. In this example, the space 227 may still exist. However, the locking mechanism 208 can be tightened to close the space 227 and the spring mechanism 206 can provide a resistive force to prevent a tension between the display 202 and the enclosure 204 even when the lip portion 210 of the locking mechanism 208 is in physical contact with the tab 226.

Figure 3:
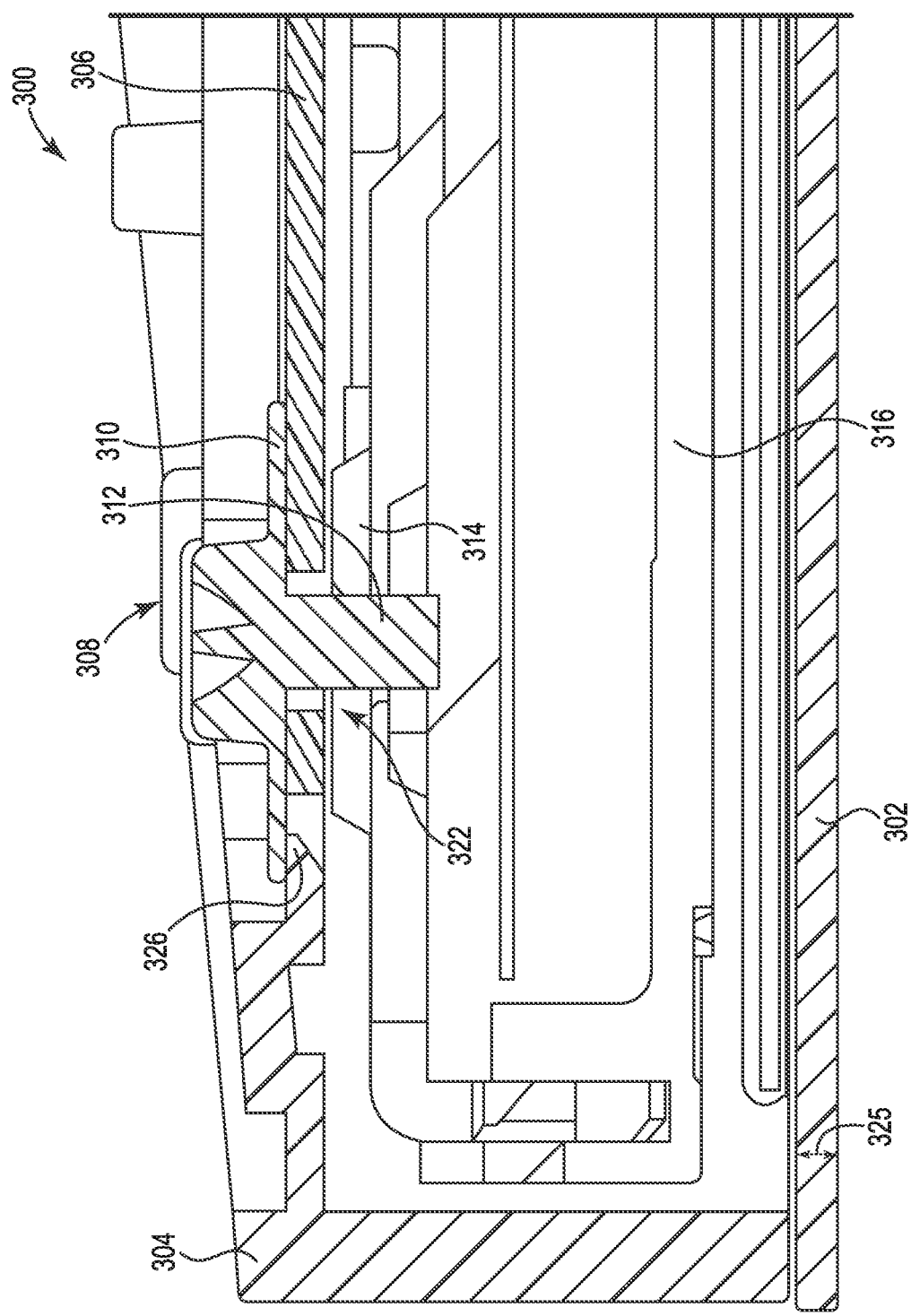
FIG. 3 is an example of a device including a spring mechanism for display enclosures, consistent with the present disclosure.

FIG. 3 is an example of a device 300 including a spring mechanism 306 for display enclosures 304, consistent with the present disclosure. In some examples, the device 300 can include the same or similar components as device 100 as referenced in FIG. 1 and/or device 200 as referenced in FIG. 2. For example, the device 300 can include a display 302 that includes components 316 that can be coupled to an enclosure 304.

In some examples, the device 300 can include an enclosure 304 to receive a display 302 with a particular thickness 325 from a plurality of displays with corresponding thicknesses. As describe herein, the enclosure 304 can be utilized with a plurality of different thicknesses including the thickness 325 of the display 302. In some examples, the device 300 can include a spring mechanism 306 that includes a first portion that is covered by the enclosure 304 and a second portion that is exposed by the enclosure 304. In these examples, the second portion can include an aperture to receive a locking mechanism 308.

As described herein, the device 300 can include a locking mechanism 308 that includes a threaded portion (e.g., extended portion 312) to pass through the aperture 322 of the spring mechanism 306 to be threaded on to a corresponding threaded portion of the display 302 and/or mounting bracket 314. In some examples, the device 300 can include a washer or lip portion 310 coupled to the locking mechanism 308 to apply pressure on the spring mechanism 306 and physically interact with a portion of the enclosure 304 (e.g., tab 326) such that the spring mechanism 306 applies a particular tension that corresponds to the particular thickness 325 when the washer or lip portion 310 is in physical contact with the enclosure 304 and/or tab 326.

As described herein, the display 302 can be coupled to the enclosure 304 utilizing a spring mechanism 306 and a locking mechanism 308. The device 300 can illustrate when the display 302 includes a gapless connection between the display 302 and the enclosure 304 when physical contact exists between the display 302 and the enclosure 304. In addition, the device 300 can illustrate when the display 302 includes a spaceless connection between the lip portion 310 of the locking mechanism 308 and a tab 326 of the enclosure 304.

In some examples, the spring mechanism 306 can include an aperture 322 that can be utilized to receive an extended portion 312 of the locking mechanism 308. As described herein, the locking mechanism 308 can be a bolt with a threaded extended portion 312 that can be threaded onto a corresponding threaded portion of the mounting bracket 314. In some examples, the locking mechanism 308 can include a lip portion 310 that can prevent the locking mechanism 308 from protruding past the spring mechanism 306 and/or to provide a force on to the spring mechanism 306. In addition, the lip portion 310 can extend beyond the spring mechanism 306 to interact with a tab 326 of the enclosure 304.

In some examples, the spring mechanism 306 can include a resilient portion to provide a force on the locking mechanism 308 away from the display 302 to relieve a tension between the display 302 and the enclosure 304 when a gap (e.g., gap 224 as illustrated in FIG. 2, etc.) is closed such that the display 302 makes physical contact with the enclosure 304. In this way, the spring mechanism 306 can be utilized to allow the locking mechanism 308 to make physical contact with the tab 326 of the enclosure 304 to close a gap between the display 302 and the enclosure 304 without exceeding a threshold tension between the display 302 and the enclosure 304. For example, without the spring mechanism 306 to apply an opposite force to the locking mechanism 308, the locking mechanism 308 may be over tightened to the mounting bracket 314 that can cause a tension between the display 302 and the enclosure 304 to exceed a tension threshold, which can damage the display 302 and/or enclosure 304. In some examples, the mounting bracket 314 can include a rigid connection with the display 302. For example, there can be a rigid connection or physical connection between the mounting bracket 314 and the display 302, such that tension applied to the mounting bracket 314 also applies tension on the display 302.

As described herein, the enclosure 304 can be utilized with a plurality of different displays including the display 302. For example, the display 302 can include a particular dimension such as a particular thickness 325. As used herein, a thickness 325 can include a distance between a front surface and a rear surface of the display 302. For example, the thickness 325 can include a distance between a first surface of the display 302 to display images and a second surface of the display that includes components 316. As described herein, the components 316 can be electrical components that can be utilized to display images on the display side of the display 302.

As described herein, the enclosure 304 can be utilized with a display 302 with a particular thickness 325. In some examples, the same enclosure 304 can be utilized with a display that includes a smaller or shorter thickness than the particular thickness 325 of the display 302. For example, the display 302 can include a smaller thickness than illustrated by the particular thickness 325. In this example, the gapless position may be altered to include a gap (e.g., gap 224 as illustrated in FIG. 2, etc.) between the display and the enclosure 304 due to the smaller thickness. However, the locking mechanism 308 can be tightened to close the gap generated by the smaller thickness and the spring mechanism 306 can provide a resistive force to prevent a tension between the display 302 and the enclosure 304 even when the lip portion 310 of the locking mechanism 308 is in physical contact with the tab 326.

Figure 4:
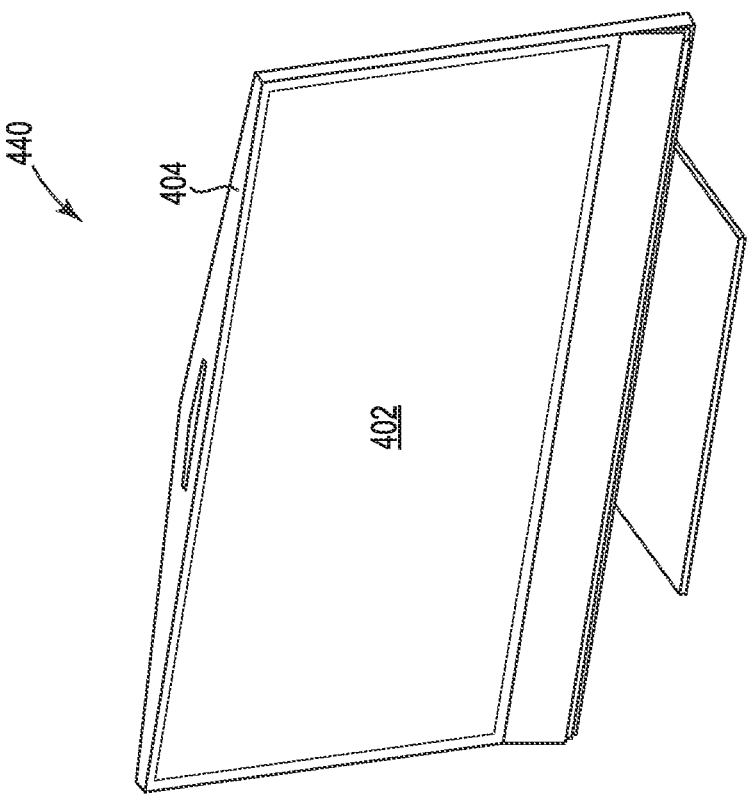
FIG. 4 is an example of a system including a spring mechanism for display enclosures, consistent with the present disclosure.
Figure 4:
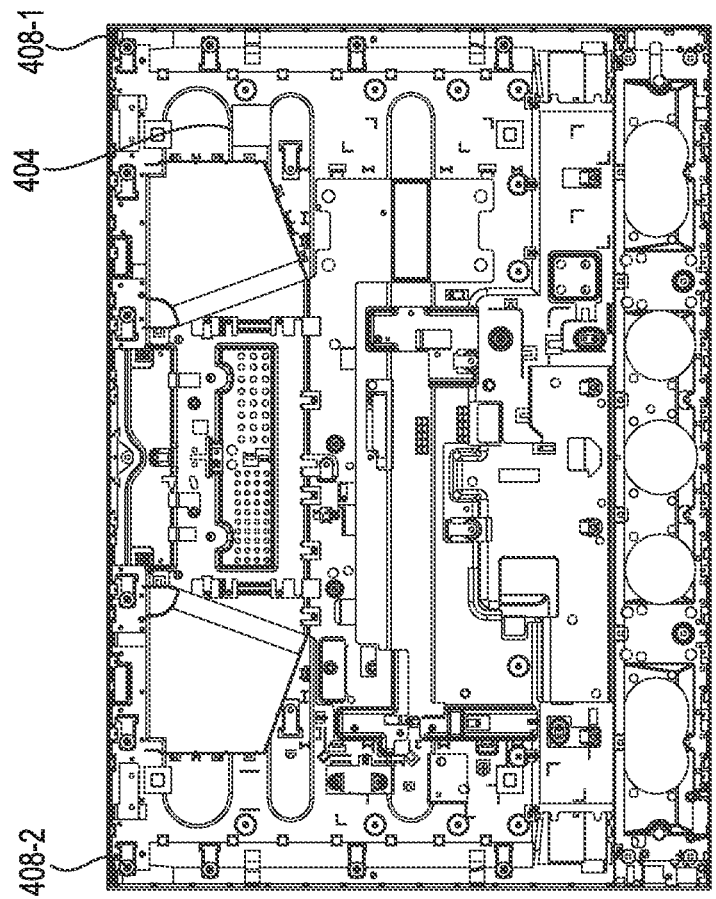

FIG. 4 is an example of a system 440 including a spring mechanism for display enclosures 404, consistent with the present disclosure. The system 440 can illustrate a rear view of a device that includes an enclosure 404 and display 402 on a left side as illustrated by FIG. 4. The system 440 can illustrate a front view of a device that includes the enclosure 404 and a display 402 on a right side as illustrated by FIG. 4.

In some examples, the rear view of the device can include an enclosure 404 that is coupled to a display 402 utilizing a plurality of locking devices 408-1, 408-2. In some examples, the plurality of locking devices 408-1, 408-2 can be similar or the same as locking device 108 as illustrated in FIG. 1, locking device 208 as illustrated in FIG. 2, and/or locking device 308 as illustrated in FIG. 3. That is, the plurality of locking devices 408-1, 408-2 can include a corresponding plurality of spring mechanisms to prevent each of the plurality of locking devices 408-1, 408-2 from exceeding a tension threshold between the enclosure 404 and the display 402.

In some examples, the plurality of locking devices 408-1, 408-2 can be positioned around a perimeter of the display 402 and/or perimeter of the enclosure 404, In this way, the tension between an edge of the enclosure 404 and/or an edge of the display 402 can be controlled utilizing the spring mechanisms described herein. In addition, potential gaps between the display 402 and the enclosure 404 can be removed by tightening the plurality of locking devices 408-1, 408-2 such that a corresponding lip portion of the plurality of locking devices 408-1, 408-2 are in physical contact with a corresponding tab of the enclosure 404. In this way, a gap between the display 402 and the enclosure 404 can be removed or reduced despite a thickness of the display 402.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. Further, as used herein, "a" refers to one such thing or more than one such thing.

The figures herein follow a numbering convention in which the first digit corresponds to the drawing figure number and the remaining digits identify an element or component in the drawing. For example, reference numeral 102 may refer to element 102 in FIG. 1 and an analogous element may be identified by reference numeral 302 in FIG. 3. Elements shown in the various figures herein can be added, exchanged, and/or eliminated to provide additional examples of the disclosure. In addition, the proportion and the relative scale of the elements provided in the figures are intended to illustrate the examples of the disclosure, and should not be taken in a limiting sense.

It can be understood that when an element is referred to as being "on," "connected to", "coupled to", or "coupled with" another element, it can be directly on, connected, or coupled with the other element or intervening elements may be present. In contrast, when an object is "directly coupled to" or "directly coupled with" another element it is understood that are no intervening elements (adhesives, screws, other elements) etc.

The above specification, examples, and data provide a description of the system and method of the disclosure. Since many examples can be made without departing from the spirit and scope of the system and method of the disclosure, this specification merely sets forth some of the many possible example configurations and implementations.

What is claimed is:

1. A device, comprising:
   a locking mechanism that includes a threaded portion;
   a display including a corresponding threaded portion to receive the threaded portion of the locking mechanism, wherein the locking mechanism applies a first force in a first direction;
   an enclosure coupled to the display with the locking mechanism;
   a spring mechanism coupled to the enclosure and the locking mechanism to prevent a tension level between the display and the enclosure from exceeding a tension threshold, wherein the spring mechanism applies a second force in a second direction: and
   a washer, coupled to the locking mechanism, to be in physical contact with the spring mechanism and the enclosure.

2. The device of claim 1, wherein a first portion of the washer interacts with the enclosure and a second portion of the washer interacts with the spring mechanism.

3. The device of claim 2, wherein the first portion of the washer interacts with the enclosure when the display is in physical contact with a portion of the enclosure.

4. The device of claim 2, wherein a dimension of a first gap between the first portion of the washer and the enclosure corresponds to a dimension of a second gap between the display and the enclosure.

5. The device of claim 1, wherein the spring mechanism includes an aperture to receive the locking mechanism.

6. The device of claim 1, wherein the spring mechanism provides a spring force on the enclosure when the washer is in physical contact with the enclosure.

7. An attachment device, comprising:
   a spring mechanism that includes a first end coupled to an enclosure and a second end that includes an aperture;
   a locking mechanism, wherein the locking mechanism includes a threaded portion to pass through the aperture and thread on to a corresponding threaded portion of a display to couple the enclosure to the display;
   a tab coupled to the enclosure to interact with the locking mechanism to prevent the locking mechanism from exceeding a tension threshold between the enclosure and the display; and
   a washer, coupled to the locking mechanism, to be in physical contact with the spring mechanism and the tab.

8. The display of claim 7, wherein the spring mechanism applies a tension on the enclosure when the washer is in physical contact with the tab.

9. The display of claim 7, wherein the threaded portion of the locking mechanism moves the display closer to the enclosure as the locking mechanism is threaded on to a corresponding threaded portion of the enclosure.

10. A system, comprising:
- an enclosure to receive a display from a plurality of displays with varying thicknesses;
- a spring mechanism that includes a first portion that is covered by the enclosure and a second portion that is exposed by the enclosure, wherein the second portion includes an aperture;
- a locking mechanism that includes a threaded portion to pass through the aperture of the spring mechanism to be threaded on to a corresponding threaded portion of the display to couple the enclosure to the display; and
- a washer coupled to the locking mechanism to be in physical contact and apply pressure on the spring mechanism and to be in physical contact with a portion of the enclosure such that the spring mechanism applies a tension that corresponds to a thickness of the display when the washer is in physical contact with the enclosure.

11. The system of claim 10, wherein the display is in physical contact with the enclosure when the washer is in physical contact with the enclosure.

12. The system of claim 10, wherein the spring mechanism includes a spring constant based on a mass of the plurality of displays.

13. The system of claim 12, wherein the spring mechanism prevents a tension between the enclosure and the plurality of displays from exceeding a tension threshold.

* * * * *